United States Patent [19]

Pfeifer et al.

[11] Patent Number: 4,707,666
[45] Date of Patent: Nov. 17, 1987

[54] FREQUENCY DEMODULATOR CIRCUIT WITH ZERO-CROSSING COUNTER

[75] Inventors: Heinrich Pfeifer, Denzlingen; Rainer Schweer, Waldkirch, both of Fed. Rep. of Germany

[73] Assignee: Deutsche ITT Industries GmbH, Freiburg, Fed. Rep. of Germany

[21] Appl. No.: 886,203

[22] Filed: Jul. 15, 1986

[30] Foreign Application Priority Data

Jul. 27, 1985 [EP] European Pat. Off. ........... 85109489

[51] Int. Cl.⁴ .............................................. H03D 3/00
[52] U.S. Cl. .................................. 329/110; 329/126; 329/145; 375/80; 455/214
[58] Field of Search ............... 329/107, 110, 122, 126, 329/145; 375/80, 88, 89, 90, 94; 455/214, 337

[56] References Cited

U.S. PATENT DOCUMENTS 4,378,526 3/1983 Champagne et al. ............... 329/104
4,634,989 1/1987 Mehrgardt ...................... 329/126 X

FOREIGN PATENT DOCUMENTS 0099142 1/1984 European Pat. Off. .
0146652 7/1985 European Pat. Off. .
1214514 12/1970 United Kingdom .

OTHER PUBLICATIONS

Patent Abstracts of Japan, Band 6, No. 21 (E-14 93), [899], Feb. 6, 1982; JP-A-56 140 706 (Nipon Denshin Denwa Kosha), 04-11-1981.
IBM Technical Disclosure Bulletin, vol. 13, No. 11, Apr. 1971, pp. 3421-3422, New York, U.S.; G. D. Jones Jr.: "Digital Frequency Discriminator".
RCA Technical Notes, No. 839, Jun. 4, 1969, pp. 1/2-2/2, RCA, Princeton, New York, U.S.; D. P. Webster et al.: "Correlation Data Demodulator".

Primary Examiner—Eugene R. Laroche
Assistant Examiner—David Mis
Attorney, Agent, or Firm—T..L. Peterson

[57] ABSTRACT

A digital frequency demodulator circuit works on the principle of determining the number of zero crossings of a band-limited input signal in a given period of time, in corresponding prior art analog circuits. The circuit includes an analog-to-digital converter, three delay elements, two edge detectors, an up/down counter, two arcsin read-only memories, a ½ multiplier and a multiple adder.

5 Claims, 1 Drawing Figure

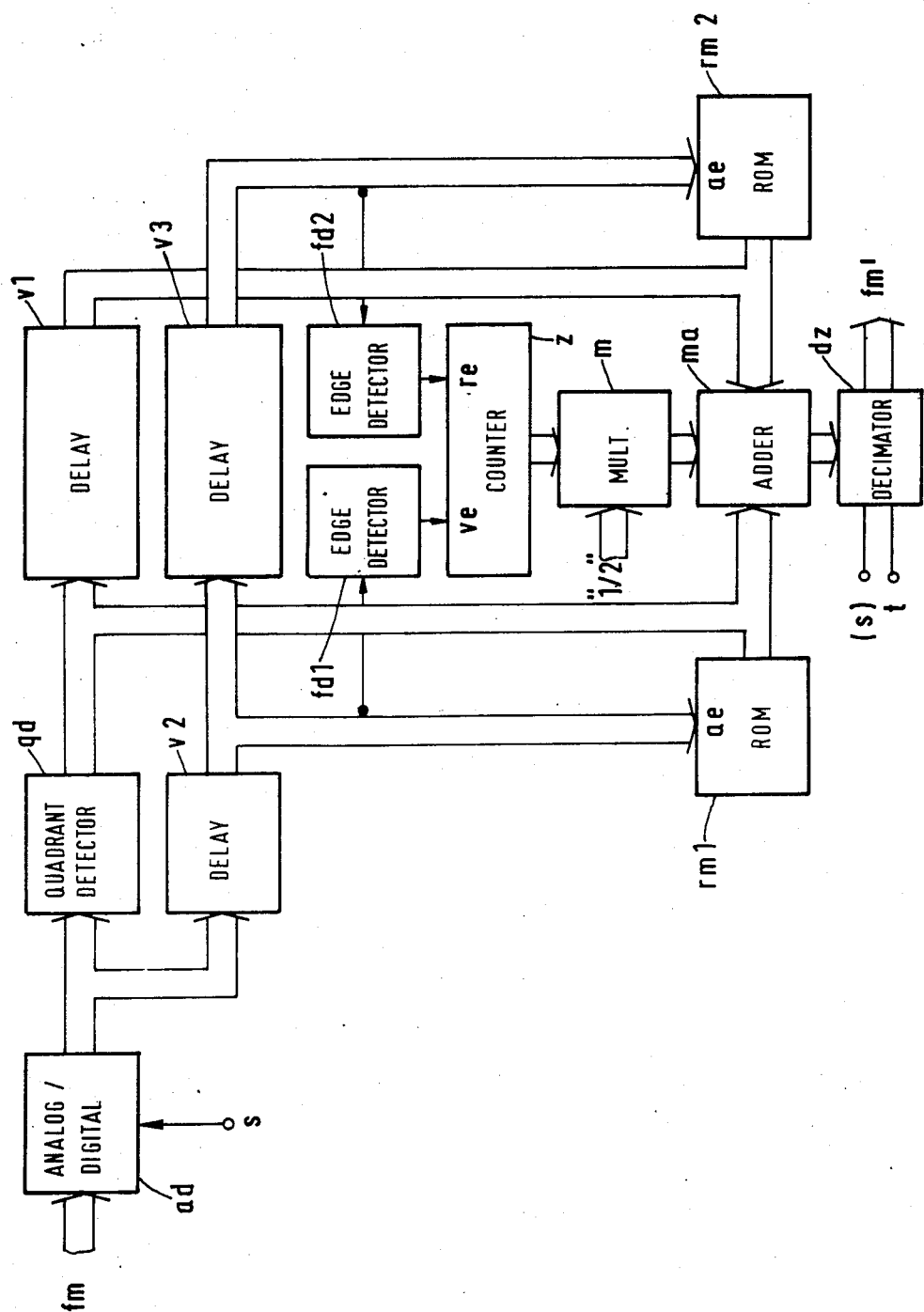

FREQUENCY DEMODULATOR CIRCUIT WITH ZERO-CROSSING COUNTER

BACKGROUND OF THE INVENTION

The invention pertains to a frequency demodulator circuit working on the principle of determining the number of zero crossings of a band-limited input signal in a given period of time by means of a periodically reset counter.

In British patent specification No. 1 214 514, page 1, this principle is briefly described for analog signals as the prior art from which the subject matter protected in that patent specification is distinguished.

SUMMARY OF THE INVENTION

One object of the invention as claimed is to eliminate the disadvantages of the known principle which are described in the patent specification referred to above which are essentially that the degree of accuracy is reduced when there is an excessive frequency deviation. The digital frequency demodulation principle which is known per se from that patent specification is to be applied to the principle of determining the number of zero crossings in a given period of time.

One of the advantages offered by the invention is that the only digital computing circuits required are adders, whereas the various embodiments of the above prior art require, inter alia, multipliers and dividers. These digital computing circuits require a considerable area on integrated circuit chips with which such frequency demodulator circuits are commonly implemented. The solution in accordance with the invention therefore has the added advantage of requiring considerably less chip area than the prior art arrangement. It can be used to advantage if relatively narrow-band signals are modulated on a high carrier frequency, as is the case with the audio signals of the common television standards (PAL, NTSC).

BRIEF DESCRIPTION OF THE DRAWING

The invention will now be explained in more detail with reference to the FIGURE of the accompanying drawing, which is a schematic circuit diagram of an embodiment of the invention.

DETAILED DESCRIPTION

The band-limited signal to be demodulated is applied as an amplitude-normalized signal fm to the input of the analog-to-digital converter ad, which is clocked by the sampling signal s. In accordance with the sampling theorem, its frequency must be chosen to be at least twice as high as the sum of the carrier frequency and half the so-called Carson bandwidth. The amplitude normalization can take place either before or after the analog-to-digital converter ad, i.e., either on the analog side or on the digital side, and may be performed by an analog or digital amplitude control circuit.

The output of the analog-to-digital converter ad is coupled to the input of the quadrant detector qd, which senses in which quarter of the period of the signal fm the instantaneous sample value of the latter lies. The term "quadrant" is used here in the same sense as in the discussion of trigonometric functions in mathematics; the first quadrant is thus the angular range from 0° to 90°, the second the angular range from 90° to 180°, the third the angular range from 180° to 270°, and the fourth the angular range from 270° to 360° or 0°. Since a digital signal for four posssible states is thus produced by means of the quadrant detector qd, this is a two-bit digital signal in the straight binary code. From the use of the quadrant detector qd, an additional condition follows for the frequency of the sampling signal s: This frequency must be greater than four times the above-mentioned sum of the carrier frequency and half the Carson bandwidth.

The output of the quadrant detector qd is fed to the first delay element v1, which provides a delay equal to k times the period of the sampling signal s, where k denotes the integral ratio of the frequency of the sampling signal s to the frequency of the clock signal t, at whose pulse repetition rate the digital words of the demodulated signal fm' are processed. In accordance with the sampling theorem, the frequency of this clock signal t must be chosen to be at least twice as high as the highest frequency occurring in the demodulated signal fm'.

The output of the analog-to-digital converter ad is also coupled to the input of the second delay element v2, which provides a delay equal to that of the quadrant detector qd and has its output connected to the input of the third delay element v3, whose delay is equal to that of the first delay element v1.

The outputs of the second and third delay elements v2 and v3 are connected to the address inputs ae of the first and second arcsin read-only memories rm1 and rm2, respectively, in which the arcsin values of the first quadrant of the sine function are permanently stored, with each address signal causing an associated argument or angle signal to be delivered at the output of the read-only memory.

The output signals of the two read-only memories rm1 and rm2 are combined with the output signals of the quadrant detector qd and the first delay element v1, respectively, i.e., the bits of the output signals of the two read-only memories are linked to the two bits of the output signals of the quadrant detector qd and the first delay element v1, respectively. These signals are fed to the multiple adder ma.

The sign bits of the outputs of the second and third delay elements v2 and v3 are fed, respectively, through the edge detectors fd1 and fd2 to the up input ve and the down input re of the up/down counter z, whose count output is fed through the $\frac{1}{2}$ multiplier m to a further input of the multiple adder ma.

The output of the multiple adder ma is followed by the decimator dz, which is clocked by the clock signal t and may also be clocked by the sampling signal s. The output of the decimator dz provides the digital demodulated signal fm'. By means of the decimator dz, the data sequence is reduced from the sampling rate to the clock rate.

The two edge detectors fd1 and fd2 respond to an H-to-L or L-to-H transition of the above-mentioned sign bit, with H and L denoting the two levels of a binary signal.

The frequency demodulator circuit according to the invention differs from the above-mentioned analog frequency demodulator not only in that it is implemented as a digital circuit, but also in specific details which follow from such an implementation and have no equivalent in the analog circuit. For example, the choice of the up/down counter z as an equivalent to the counter used in the known principle eliminates the need for the periodic resetting. While, in the known principle, the measured time is the time between two reset pulses, in the invention, the delay produced by the first and third delay elements v1, v3, which is determined by the quantity k, is equivalent to the measured time.

In the invention, the qudrant detector qd and the three delay elements v1, v2, v3 are clocked circuits to which the clock signal s is applied; this is not shown in the figure to simplify the illustration. The decimator dz is a clocked circuit, too.

As mentioned at the beginning, the frequency demodulator circuit according to the invention can be implemented using integrated-circuit techniques, with insulated-gate field-effect transistor integrated circuits (MOS circuits) being particularly advantageous, because it is an all-digital circuit.

What is claimed is:

1. A frequency demodulator circuit comprising:
   an analog to digital converter receiving an input signal to be demodulated and clocked by a sampling signal at a first frequency;
   a quadrant detector having its input connected to the output of said analog-to-digital converter;
   first delay means having its input coupled to said analog-to-digital converter output;
   second delay means having its input coupled to said analog-to-digital converter output;
   third delay means having its input coupled to the output of said second delay means;
   a first edge detector coupled to the sign bit of the output of said second delay means output;
   a second edge detector coupled to a sign bit of the output of said third delay means;
   an up/down counter having an up input coupled to the output of said first edge detector and having a down input coupled to the output of said second edge detector;
   means for multiplying the output of said up/down counter by $\frac{1}{2}$;
   first arcsin memory means having address inputs coupled to the output of said first delay means and having data outputs;
   second arcsin memory means having address inputs coupled to the output of said third delay means and having data outputs;
   a multiple adder for adding the output of said multiplying means to said first arcsin memory means data outputs combined with the outputs of said quadrant detector and to said second arcsin memory means data outputs combined with the output of said first delay means; and
   a decimator having inputs coupled to the output of said multiple adder, said decimator being clocked by said sampling signal and providing a digital demodulated output signal.

2. A frequency demodulator circuit in accordance with claim 1, wherein:
   said first delay means and said third delay means each provided a delay equal to k times the period of said sampling signal, where k is equal to the integral ratio of the frequency of said sampling signal to the frequency of a clock signal at the pulse repetition rate of which the digital words of said demodulated signal are to be processed.

3. A frequency demodulator circuit in accordance with claim 2, wherein:
   said decimator is further clocked by said clock signal.

4. A frequency demodulator circuit in accordance with claim 2, wherein:
   said second delay means provides a delay equal to that of said quadrant detector.

5. A frequency demodulator circuit in accordance with claim 1, wherein:
   said input signal is band limited and amplitude normalized.

* * * * *